US011290080B2

(12) United States Patent
Ouyang et al.

(10) Patent No.: US 11,290,080 B2
(45) Date of Patent: Mar. 29, 2022

(54) RETUNING FOR IMPEDANCE MATCHING NETWORK CONTROL

(71) Applicant: COMET TECHNOLOGIES USA, INC., San Jose, CA (US)

(72) Inventors: Liang Ouyang, San Jose, CA (US); Daniel Catalan, San Jose, CA (US); Anthony Oliveti, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 41 days.

(21) Appl. No.: 16/768,224

(22) PCT Filed: Nov. 29, 2018

(86) PCT No.: PCT/US2018/062951
§ 371 (c)(1),
(2) Date: May 29, 2020

(87) PCT Pub. No.: WO2020/112108
PCT Pub. Date: Jun. 4, 2020

(65) Prior Publication Data
US 2020/0412322 A1 Dec. 31, 2020

Related U.S. Application Data

(60) Provisional application No. 62/592,319, filed on Nov. 29, 2017.

(51) Int. Cl.
*H03H 7/38* (2006.01)
*H01J 37/32* (2006.01)

(52) U.S. Cl.
CPC ......... *H03H 7/38* (2013.01); *H01J 37/32183* (2013.01); *H01J 2237/332* (2013.01)

(58) Field of Classification Search
CPC ............................. H03H 7/38; H01J 37/32183
See application file for complete search history.

(56) References Cited

U.S. PATENT DOCUMENTS

| 4,679,007 A | 7/1987 | Reese et al. |
| 5,195,045 A | 3/1993 | Keane et al. |

(Continued)

FOREIGN PATENT DOCUMENTS

| WO | 2012054305 | 4/2012 |
| WO | 2012054306 | 4/2012 |
| WO | 2012054307 | 4/2012 |

OTHER PUBLICATIONS

PCT/US2018/062951—International Search Report and Written Opinion of International Searching Authority, dated Aug. 28, 2019, 10 pages.

(Continued)

*Primary Examiner* — Samuel S Outten
(74) *Attorney, Agent, or Firm* — Nolte Lackenbach Siegel

(57) ABSTRACT

A physical vapor deposition system may include an RF generator configured to transmit an AC process signal to a physical vapor deposition chamber via an RF matching network. A controller of the RF matching network is configured to receive the DC magnitude and phase error signals and to vary an impedance of the RF matching network in response to the DC magnitude and phase error signals. The matching network operates in a first mode until a tuning dead-zone is determined. Once a tuning dead-zone is determined, the matching network operates in additional modes until the network is tuned. The controller uses a composite value of magnitude and phase error to drive of the variable tuning and load capacitors.

20 Claims, 7 Drawing Sheets

(56) References Cited

U.S. PATENT DOCUMENTS

| | | |
|---|---|---|
| 5,394,061 A | 2/1995 | Fujii |
| 5,576,629 A | 11/1996 | Turner et al. |
| 5,609,737 A | 3/1997 | Fukui et al. |
| 5,629,653 A | 5/1997 | Stimson |
| 5,737,175 A | 4/1998 | Grosshart et al. |
| 5,792,261 A | 8/1998 | Hama et al. |
| 5,810,963 A | 9/1998 | Tomioka |
| 5,842,154 A | 11/1998 | Harnett et al. |
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 | 11/2001 | Johnson et al. |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,463,875 B1 | 10/2002 | Chen et al. |
| 6,507,155 B1 | 1/2003 | Barnes et al. |
| 6,677,828 B1 | 1/2004 | Harnett et al. |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman |
| 6,949,887 B2 | 9/2005 | Kirkpatrick et al. |
| 7,030,335 B2 | 4/2006 | Hoffman |
| 7,042,311 B1 | 5/2006 | Hilliker et al. |
| 7,079,597 B1 | 7/2006 | Kenwood |
| 7,102,292 B2 | 9/2006 | Parsons et al. |
| 7,192,505 B2 | 3/2007 | Roche et al. |
| 7,196,283 B2 | 3/2007 | Buchberger, Jr |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilie |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley et al. |
| 9,577,516 B1 | 2/2017 | Van Zyl et al. |
| 9,584,090 B2 | 2/2017 | Mavretic |
| 9,578,731 B2 | 3/2017 | Hoffman et al. |
| 9,591,739 B2 | 3/2017 | Bhutta |
| 9,589,767 B2 | 4/2017 | Finley et al. |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Kamstedt |
| 10,194,518 B2 | 1/2019 | Van Zyl et al. |
| 10,217,618 B2 | 2/2019 | Larson et al. |
| 10,224,184 B2 | 3/2019 | Van Zyl et al. |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 2003/0230984 A1 | 12/2003 | Kitamura et al. |
| 2004/0026235 A1 | 2/2004 | Stowell, Jr. |
| 2005/0045475 A1 | 3/2005 | Wantanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |
| 2007/0121267 A1 | 5/2007 | Kotani |
| 2008/0061901 A1 | 3/2008 | Gilmore |
| 2008/0317974 A1 | 12/2008 | de Vries |
| 2009/0026964 A1 | 1/2009 | Knaus |
| 2010/0012029 A1 | 1/2010 | Forester et al. |
| 2010/0096261 A1 | 4/2010 | Hoffman et al. |
| 2010/0098882 A1 | 4/2010 | Lubomirsky et al. |
| 2010/0314048 A1 | 12/2010 | Long et al. |
| 2011/0121735 A1 | 5/2011 | Penny |

(56) References Cited

U.S. PATENT DOCUMENTS

| | | |
|---|---|---|
| 2011/0140607 A1 | 6/2011 | Moore et al. |
| 2011/0148303 A1 | 6/2011 | Van Zyl et al. |
| 2011/0214811 A1* | 9/2011 | Ashida .................. C23C 16/50 |
| | | 156/345.28 |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0262064 A1 | 10/2012 | Nagarkatti |
| 2013/0140984 A1 | 6/2013 | Hirayama |
| 2013/0214683 A1 | 8/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0313000 A1 | 10/2015 | Thomas et al. |
| 2016/0002020 A1 | 1/2016 | Orita |
| 2016/0308560 A1 | 10/2016 | Howald et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0115298 A1* | 4/2018 | Fujimoto .................. H03H 7/40 |
| 2019/0172683 A1 | 6/2019 | Mavretic |
| 2019/0199241 A1 | 6/2019 | Satoshi et al. |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

\* cited by examiner

| Row | Phase | Mag | Zi | Tuned | Time | Chart |
|---|---|---|---|---|---|---|
| 1 | C2+ | C1+ | 20-j40 | No | n/a | 502 |
| 2 | C2+ | C1+ | 20+j0 | No | n/a | 506 |
| 3 | C2+ | C1+ | 20+j40 | No | n/a | 510 |
| 4 | C2+ | C1+ | 5-j40 | Yes | 1.5s | 602 |
| 5 | C2+ | C1+ | 5+j0 | Yes | 1.3s | 606 |
| 6 | C2+ | C1+ | 5+j40 | Yes | 0.8s | 610 |
| 7 | C2+ | C1+ | 0.5-j40 | Yes | 2.1s | 702 |
| 8 | C2+ | C1+ | 0.5+j0 | Yes | 2s | 706 |
| 9 | C2+ | C1+ | 0.5+j40 | Yes | 1.8s | 710 |
| 10 | C1+ | C2- | 20-j40 | Yes | 2.8s | 504 |
| 11 | C1+ | C2- | 20+j0 | Yes | 2.8s | 508 |
| 12 | C1+ | C2- | 20+j40 | Yes | 2.4s | 512 |
| 13 | C1+ | C2- | 5-j40 | Yes | 3.2s | 602 |
| 14 | C1+ | C2- | 5+j0 | Yes | 3.1s | 606 |
| 15 | C1+ | C2- | 5+j40 | Yes | 2.9s | 610 |
| 16 | C1+ | C2- | 0.5-j40 | No | n/a | 702 |
| 17 | C1+ | C2- | 0.5+j0 | No | n/a | 706 |
| 18 | C1+ | C2- | 0.5+j40 | Yes | 3.5 | 710 |

*TABLE 1*

*FIG. 4*

RETUNING FOR IMPEDANCE MATCHING NETWORK CONTROL

This application claims benefit of PCT/US2018/062951 filed on Nov. 29, 2018, which claims priority to U.S. Prov. Appl. No. 62/592,319, filed Nov. 29, 2017, the contents of both are hereby incorporated by reference to the extent not inconsistent with the present disclosure.

Chip makers and tool makers use chambered gases and radio frequency ("RF") waves to discharge the gases to generate plasma. For example, physical vapor deposition ("PVD") systems are used to deposit thin layers of a target material onto a substrate. PVD systems generally include a RF generator that transmits a signal to a deposition chamber. An RF match having a variable impedance is generally located between the RF generator and the chamber. RF waves arrive from the RF generator passing through a cable, through the matching network, and then to the plasma chamber. The purpose of the matching network is to make the chamber and the RF match set to a particular impedance, such as 50 Ohms. The RF match may be tuned, i.e., the impedance may be varied, to make the impedance of the RF match be the complex conjugate of the deposition chamber's impedance. Tuning the RF match reduces reflected power from the chamber, thereby increasing the power transferred from the RF generator to the chamber and into the plasma deposition process.

Conventional RF matches, however, encounter a problem with dead-zones, also referred to as lost conditions. Sometimes the matching network cannot determine a tuning point successfully. In such cases, tuning capacitors may move to higher/lower limit and stay in a stuck position (railing), or keep oscillating around some position (oscillation). There is a need, therefore, for an improved RF match that overcomes the deficiencies of conventional systems.

Embodiments of the disclosure may provide a method for tuning an impedance matching network. While receiving an RF input signal, a current value, a voltage value, and a phase value are determined based on the RF input signal. A phase error value and a magnitude error value are determined based the input signal values. The matching network performs tuning using two or more tuning modes. In a first tuning mode, the position of a first variable capacitor is adjusted based on the magnitude error value, and a second variable capacitor is adjusted based on the phase error value. The matching network determines whether a dead-zone has occurred. If a dead-zone has occurred in the first tuning mode, then a second tuning mode is performed to move the network out of the tuning error. In the second tuning mode, the position of the first variable capacitor is changed based on a first composite value of the magnitude error value and the phase error value, and the position of the second variable capacitor is changed based on a second composite value of the magnitude error value and the phase error value. The matching network determines whether the matching network has reached a tuned state, and if the matching network has reached a tuned state, then the matching network switches back to the first tuning mode. The matching network remains in the first tuning mode until another dead-zone is determined to have occurred, and then switches to the second tuning mode to move the network out of the dead-zone.

Embodiments of the disclosure may further provide a matching network system including an input sensor coupled to a controller. The input sensor is configured to determine a current value, a voltage value, and a phase value between the current value and the voltage value of a received RF input signal to the input sensor. A first motor is coupled to the controller, and the first motor is coupled to a variable load capacitor. A second motor is coupled to the controller, and the second motor is coupled to a variable tuning capacitor. The controller is configured to determine a phase error value and a magnitude error value. The controller performs tuning of the load capacitor and tuning capacitor using two or more modes to tune the matching network system. In a first tuning mode the controller, sending a signal the first motor, adjusts the position of the load capacitor based on the phase error value. In this first tuning mode, the controller sending a signal to the second motor, adjusts the position of the tuning capacitor based on the magnitude error. The controller determines whether a dead-zone has occurred in the matching network. If a dead-zone has occurred in the first tuning mode, then the controller performs a second tuning mode. In the second tuning mode, the position of the tuning capacitor is based on a first composite value of the magnitude error value and the phase error value. Also, the position of the load capacitor is based on a second composite value of the magnitude error value and the phase error value. The matching network system determines whether the matching system has reached a tuned state, and if the matching network system has reached a tuned state, then it performs the first tuning mode. The matching network remains in the first tuning mode until another dead-zone is determined to have occurred, and then switches to the second tuning mode to move the network out of the dead-zone.

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 4 illustrates an exemplary table describing combinations of phase and mag capacitor control combinations.

Figure 1:
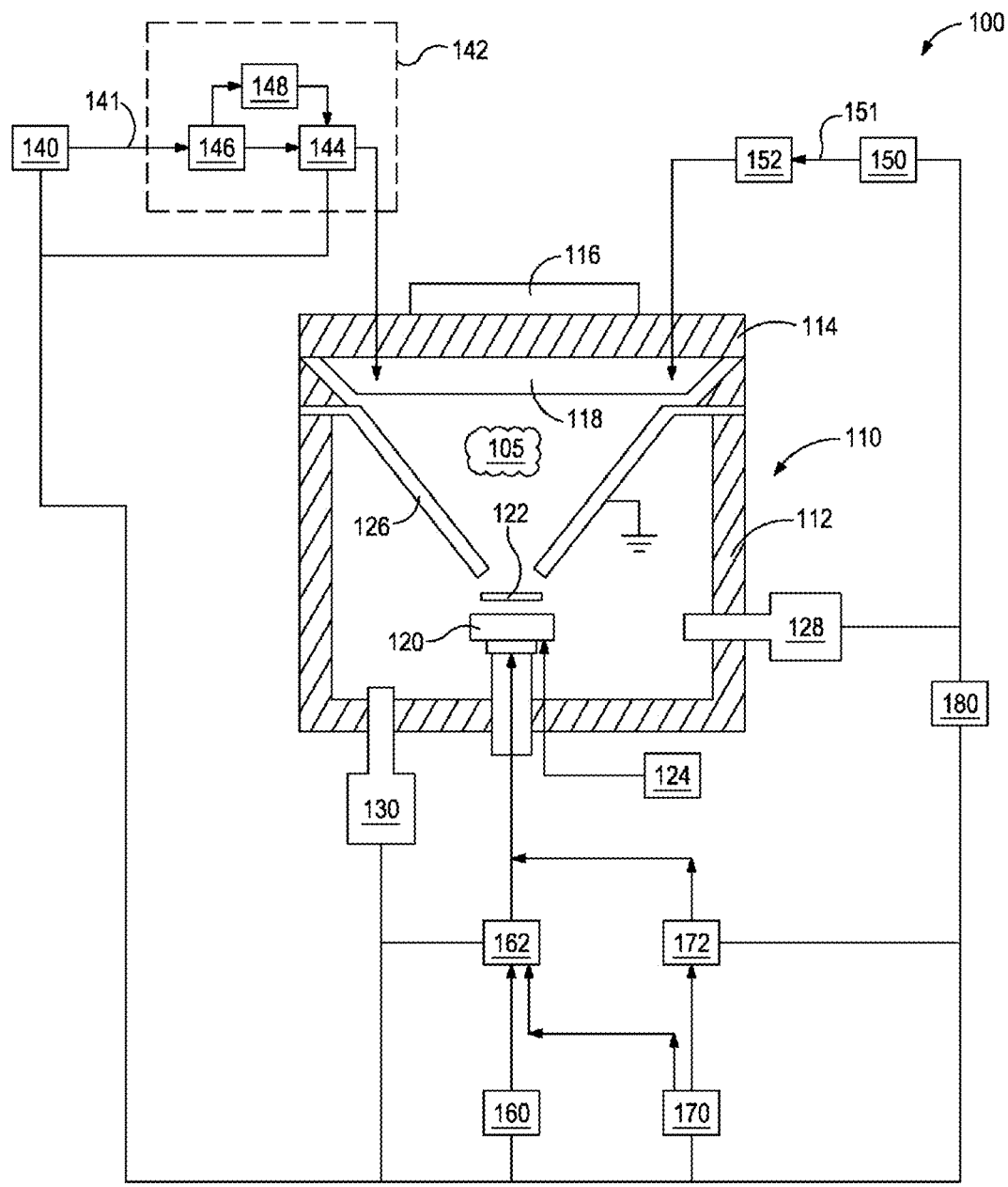
FIG. 1 illustrates an exemplary physical vapor deposition system, according to one or more embodiments described.

FIG. 1 illustrates an exemplary physical vapor deposition ("PVD") system 100 of this disclosure. The PVD system 100 may include a chamber 110 having a body 112 and a lid or ceiling 114. A magnet assembly 116 may be disposed on an outer side of the lid 114. In at least one embodiment, the magnet assembly 116 may be a permanent magnet disposed on a plate that is rotated by a motor between about 0.1 revolutions per second and about 10 revolutions per second. For example, the magnet assembly 116 may rotate in a counterclockwise direction at about 1 revolution per second.

A target 118 is generally positioned on an inner side of the lid 114 generally opposite the magnet assembly 116. In at least one embodiment, the target 118 may be at least partially composed of, but is not limited to, elements such as, borides, carbides, fluorides, oxides, silicides, selenides, sulfides, tellerudes, precious metals, alloys, intermetallics, or the like. For example, the target 118 may be composed of copper (Cu), silicon (Si), gold (Au), titanium (Ti), tantalum (Ta), tungsten (N), aluminum (Al), a combination thereof, or the like.

A pedestal 120 may be disposed in the chamber 110 and configured to support a substrate 122. In at least one embodiment, the pedestal 120 includes a chuck configured to hold the substrate 122 to the pedestal 120. Suitable chucks may include mechanical chucks, vacuum chucks, electrostatic chucks ("e-chucks"), or the like. Mechanical chucks include one or more clamps to hold the substrate 122 to the pedestal 120. Vacuum chucks include a vacuum aperture coupled to a vacuum source to hold the substrate 122 to the pedestal 120. E-chucks rely on the electrostatic pressure generated by an electrode to hold the substrate 122 to the pedestal 120. In at least one embodiment, the pedestal 122 may be or include an e-chuck powered by a DC power supply 124.

A shield 126 may at least partially surround the pedestal 120 and the substrate 122 and be electrically grounded, for example, by physical attachment to the chamber body 112. The shield 126 is generally configured to receive deposition particles that would normally deposit on the interior walls of the chamber 110 during the PVD process.

A gas supply 128 may be coupled to the chamber 110 and configured to introduce a controlled flow of a process gas into the chamber 110. In at least one embodiment, the process gas introduced to the chamber 110 may include Argon (Ar), Nitrogen ($N_2$), Hydrogen ($H_2$), Helium (He), Xenon (Xe), a combination thereof, or the like.

A vacuum pump 130 may be coupled to the chamber 110 and configured maintain a desired sub-atmospheric pressure or vacuum level in the chamber 110. In at least one embodiment, the vacuum pump 130 may maintain a pressure of between about 1 millitorr and about 100 millitorrs in the chamber 110 during a deposition process.

A first radio frequency ("RF") generator 140 may be configured to supply an AC process signal 141 at a frequency F1 to the chamber 110. In at least one embodiment, F1 may be between about 30 Hz and about 300 MHz. For example, F1 may be between about 30 MHz and about 162 MHz. A first RF match system 142 may be coupled to the RF generator 140 and configured to decrease reflected power from the load, i.e., the chamber 110, thereby increasing the power transferred from the RF generator 140 to the chamber 110. The RF match system 142 may be or include an RF matching network 144 having a variable impedance. The power transfer from the first RF generator 140 to the chamber 110 via the RF matching network 144 is maximized when the impedance of the RF matching network 144 is adjusted to equal or approximate the complex conjugate of the impedance of the chamber 110. In at least one exemplary embodiment, when the impedance of the RF matching network 144 reaches the complex conjugate of the impedance of the chamber 110, the RF generator 140 will see an impedance of about 50 ohms at the input of the RF matching network 144.

In at least one embodiment, a detector circuit 146 may be coupled to or disposed within the RF match system 142. The detector circuit 146 may be configured to detect or sense the process signal 141 from the RF generator 140 and to generate a magnitude error signal and a phase error signal.

A match controller 148 may be coupled to the RF matching network 144 and the detector circuit 146. In at least one embodiment, the match controller 148 may be coupled to or be part of the RF match system 142. In another embodiment, the match controller 148 may be coupled to or be part of an overall system controller 180. The match controller 148 may be configured to adjust the impedance of the RF matching network 144 in response to the magnitude and phase error signals from the detector circuit 146 to decrease reflected power from the chamber 110.

A DC generator 150 may supply a DC signal 151 to the chamber 110. A DC filter 152 may be coupled to the DC generator 150 and configured to block or prevent the process signal 141 and corresponding harmonics from the RF generator 140 from reaching and damaging the DC generator 150.

A second RF generator 160 may be configured to supply an AC signal at a frequency F2 to the pedestal 120. In at least one embodiment, the signal from the second RF generator 160 may be used to bias the chamber 110 and/or the pedestal 120. A second RF match system 162 may be coupled to and receive the signal from the second RF generator 160. The second RF match system 162 may be the same as the first RF match 142 system, e.g., a double input match, or it may be different, as desired.

In at least one embodiment, a third RF generator 170 may be configured to supply a signal at a frequency F3 to the pedestal 120. In at least one embodiment, the second RF generator 160 and the third RF generator 170 may be coupled to a single RF match system 162. In another embodiment, the third RF generator 170 may be coupled to a third RF match system 172. The third RF match system 172 may be the same as the first and/or second RF match systems 142, 162, or it may be different, as desired. Although not shown, one or more additional RF generators and corresponding RF matches may be implemented in the PVD system 100.

A system controller 180 may be coupled to one or more of the gas supply 128, the vacuum pump 130, the RF generators 140, 160, 170, and the DC generator 150. In at least one embodiment, the system controller 180 may also be coupled to one or more of the RF match systems 142, 162, 172. The system controller 180 may be configured to control the various functions of each component to which it is coupled. For example, the system controller 180 may be configured to control the rate of gas introduced to the chamber 110 via the gas supply 128. The system controller 180 may be configured to adjust the pressure within the chamber 110 with the vacuum pump 130. The system controller 180 may be configured to adjust the output signals from the RF generators 140, 160, 170, and/or the DC generator 150. In at least one embodiment, the system controller 180 may be configured to adjust the impedances of the RF match systems 142, 162, 172.

Figure 2:
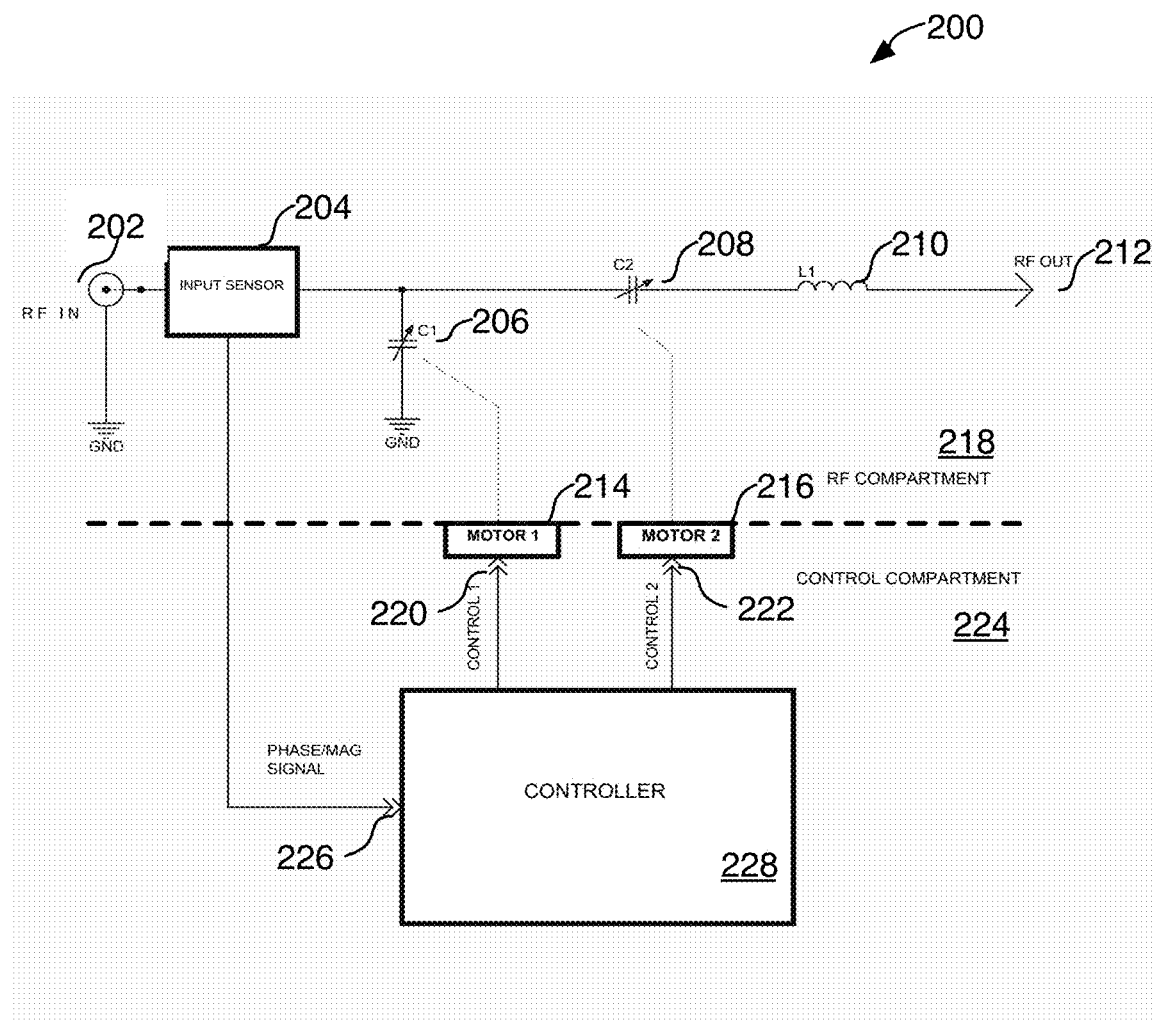
FIG. 2 illustrates an exemplary matching network from FIG. 1, according to one or more embodiments described.

FIG. 2 illustrates an exemplary matching network 200 of this disclosure. There is a sensor at an input point 202 of the matching network 200. The sensor may be coupled to the detector circuit 146, or to the RF generator 140. The input sensor 202 measures current, voltage and the phase of the incoming RF signal at the input point 202.

The input sensor 204 is coupled to a controller 228, such as a computer or processor. The controller 228 receives the phase and magnitude signal from the input sensor 204. The controller 228 is coupled to a first motor 214 and to a second motor 216. The controller 228 and first and second motors 214, 216 are located within a control compartment 224. The controller 228 as further described below operates the first and second motors 214, 216. The controller 228 sends a signal 220 to the first motor 214 which is operatively coupled to the variable load capacitor (C1) 206, thereby adjusting the positional setting of the load capacitor 206. Similarly, the controller 228 sends a signal 222 to the second motor 216 which is operatively coupled to the variable tuning capacitor (C2) 208, thereby adjusting the positional setting of the tuning capacitor 208. The load capacitor 206 and tuning capacitor 208 are located within an RF compartment 218. The tuning capacitor 208 is coupled in series to an inductor L1210 which is coupled to an RF output 212.

The input sensor 204 measures current, voltage and phase between the voltage and the current. Based on these three signals, the controller determines the difference between the current load and a target state load, for example a target load of 50 Ohms.

The controller 228 is configured to receive the DC magnitude and phase error signals and to vary an impedance of the RF matching network 200 in response to the DC magnitude and phase error signals. The matching network 200 operates in a first mode until a tuning dead-zone is determined. Once a tuning dead-zone is determined, the matching network 200 operates in additional modes until the matching network 200 is tuned. The controller 228 uses a composite value of magnitude and phase error to drive the tuning capacitor 208 and the load capacitor 206.

The controller 228 determines a magnitude difference which is referred to as mag error. Also, the controller determines a phase difference which is referred to as phase error. The controller 228 uses the mag error and phase error signals to control the variable load and tuning capacitors 206 and 208. Typically, the match network will have two variable capacitors, but can be configured with three or more variable capacitors.

The controller 228 may perform one or more modules, programs or instructions for determining the magnitude error and the phase error, and for instructing the first and second motors 214, 216 to position the variable load and tuning capacitors 206 and 208. The modules, programs or instructions may be stored in firmware, or other storage media. In one embodiment, the controller operates in a first, second and third tuning modes. Additional, n-modes may be performed for the specific application of the matching network.

Figure 3:
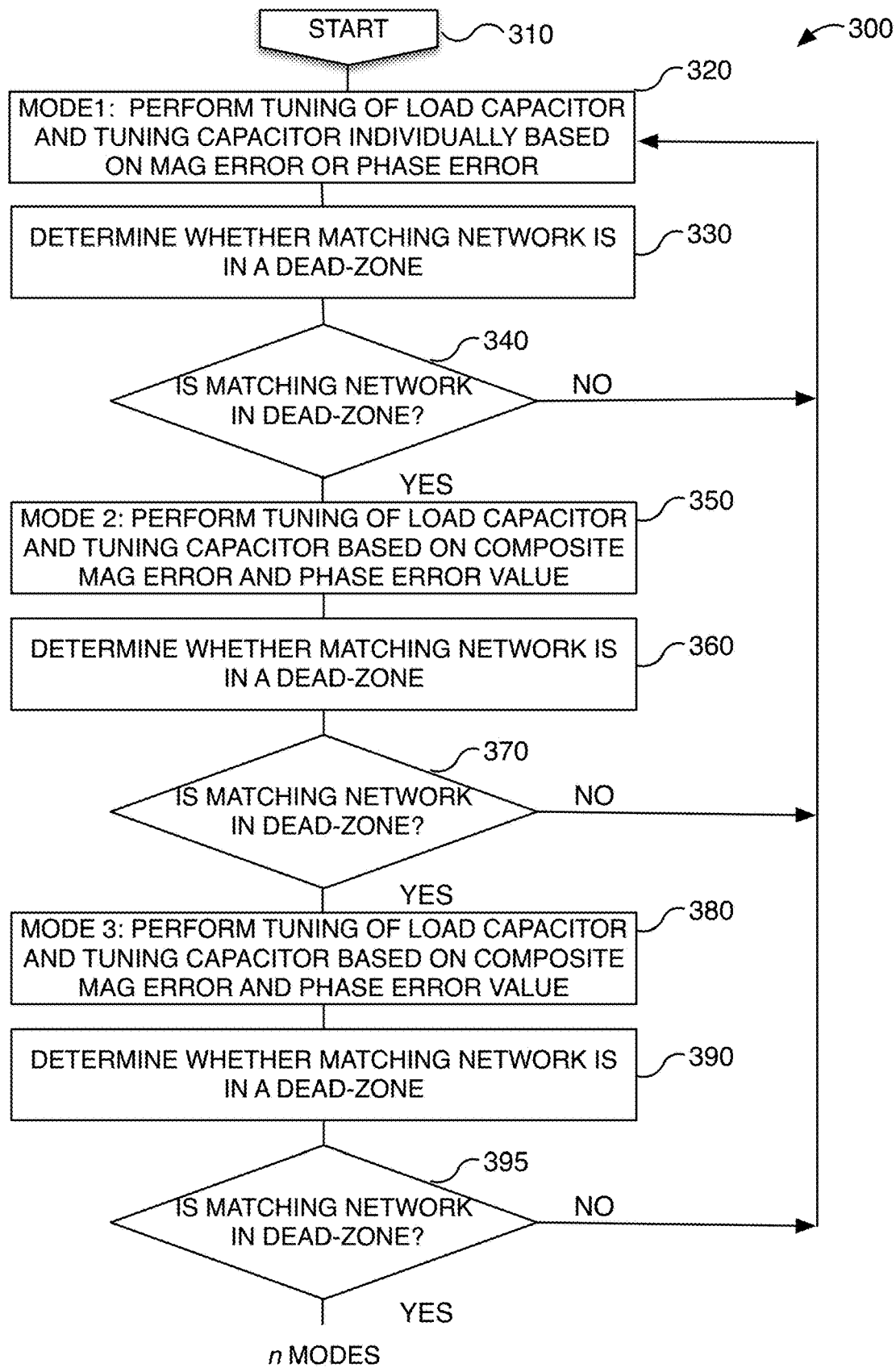
FIG. 3 illustrates an exemplary method for varying an impedance of an RF matching network, according to one or more embodiments described.

FIG. 3 illustrates an exemplary method 300 for varying an impedance of an RF matching network, according to one or more embodiments described. The method 300 starts, as at 310, and the match network operates in a first mode while performing tuning 320 of the variable capacitors individually based on mag error or phase error. The controller determines 330 whether the matching network is in a dead-zone (for example in a state of railing or oscillation). At 340, if the matching network is not in a dead-zone, then the controller continues to operate in mode 1. If the matching network is determined to be in a dead-zone, then the controller switches operation to a second mode.

The match network operates in the second mode and performs tuning 350 of the variable capacitors based on composite mag error and phase error values. The controller determines 360 whether the matching network is in a dead-zone. At 370, if the matching network is not in a dead-zone, then the controller switches operation back to mode 1. If the matching network is determined to be in a dead-zone, then the controller switches operation to a third mode.

The match network operates in the third mode and performs tuning 380 of the variable capacitors based on composite mag error and phase error values. The controller determines 390 whether the matching network is in a dead-zone. At 395, if the matching network is not in a dead-zone, then the controller switches operation back to mode 1. If the matching network is determined to be in a dead-zone the matching network may switch to additional n modes trying to kick the tuning network out of a dead-zone. The controller will then revert back to mode 1 if the network is no longer in a dead-zone.

As discussed above, the controller 228 operates in a first mode, or a normal operating mode, where the controller positions the variable load and tuning capacitors 206 and 208. The controller 228 operates in this first mode to tune the matching network 200 to reduce reflected power to as close to zero kilowatts as possible. In this first mode, the tuning process works for most of the tuning area. The variable load and tuning capacitors 206 and 208 are set to an initial position, for example, both variable load and tuning capacitors 206 and 208 are set at 50% of their positional range. The controller 228 uses phase error and mag error to guide the variable load and tuning capacitors 206 and 208 then to a desired target position. In this first mode, the controller 228 uses one signal, either the phase error or mag error, to control one of the variable load and tuning capacitors 206 and 208, either C1 or C2.

Using the magnitude of these two signals and the polarity of the two signals the controller 228 determines how fast or the rate at which the variable load and tuning capacitors 206 and 208 turn, and in which direction the variable load and tuning capacitors 206 and 208 turn. For example, the higher the error, the higher the rate at which a capacitor may turn, up to a predetermined maximum limit. In one embodiment, if the error is negative, the capacitance is reduced. And if the error is positive, capacitance is increased. The polarity usually drives the capacitors to the correct direction. For some cases, at some special corners, the controller 288 may drive either variable capacitor 206, 208 in an incorrect direction which may lead to an out-of-tune state, and cause railing or oscillation. In these instances, one of the variable capacitors 206, 208 is likely set at a very high or very low positional limit of the capacitor. And since the signal keeps driving to the variable capacitor 206, 208 to an opposite direction it cannot come back up.

In some situations, one of the variable load and tuning capacitors 206, 208 may stop at a position for a period of time and then oscillate around this position. If this happens, at the same time the reflected power may still be high, then would be considered as a dead-zone. Usually, the matching network 200 does not determine the occurrence of a dead-zone, until it happens.

As discussed above, the controller 228 usually operates in a first mode, or normal operating mode for regular tuning. For example, positive phase error controls C2 (tuning capacitor 208) and positive mag error controls C1 (load capacitor 206). The controller 228 monitors and determines whether a tuning failure occurs while operating in the first mode (for example, whether railing or oscillation is occurring). For, example the controller 228 may determine a tuning failure or dead-zone, when one of the variable capacitor 206, 208 stops moving before reaching the particular target load. In a normal tuning situation, the capacitors will move until reaching a target load. If a tuning failure is determined while operating in the first mode, then the controller 228 switches to a second mode for tuning.

For example, in the first mode, the controller 228 individually adjusts C1 and C2. Possibly C1 may be driven to a minimum position of 0% and C2 goes to maximum position of 100%. The incoming signal keeps driving C2 up, and the incoming signal keeps driving C1 down. In this case, the variable load and tuning capacitors 206 and 208 will stay in their position. The controller will evaluate this state and determine that the matching network is in a dead-zone.

The following formula describes the application of an embodiment of the first mode:

a1*Phase_error+b1*Mag_error controls load capacitor(C1);

c1*Phase_error+d1*Mag_error controls tune capacitor(C2).

where a1=1, b1=0, c1=0, d1=1. In this first mode, only the phase error value drives the load capacitor 206, and only the mag error value drives the tuning capacitor 208.

In the second mode, the controller 228 can mix a percentage of phase error and mag error to generate a new signal, then use two new signals to adjust C1 and C2. The controller 228 may adjust the tuning capacitor 208 based on a first composite value of the magnitude error value and the phase error value, and the load capacitor 206 based on a second composite value of the magnitude error value and the phase error value. The following formula describes the application of an embodiment of the second mode:

a2*Phase_error+b2*Mag_error controls load capacitor(C1);

c2*Phase_error+d2*Mag_error controls tune capacitor(C2).

In the second mode, a2, b2, c2, d2 are predetermined real coefficient values (positive or negative) to optimize tuning for a varying load range. For instance, a2=1, b2=0, C2=0, d2=−1. In this example, the coefficient values are integer values. Therefore, if the load falls into the load range, the second mode will drive the network out of the dead-zone, and find the tuning point. Based on the phase error and mag error and the applied coefficient values, there may be one or more combinations of coefficient values that will take the matching network out of a dead-zone.

In some embodiments, in modes 2, 3 and other n mode, coefficient values may be a combination of fractional and integer values, such as 0.6*Phase_error-0.4*Mag_error controls tune capacitor (C1), and 1*Phase_error-0*Mag_error controls load capacitor (C2). In other words, a2=0.6, b2=−0.4, c2=1, and d2=0.

In the second mode, the controller 228 adjusts the load capacitor 206 based on the value a2 multiplied by the phase error which is added to the value b2 multiplied by the mag error. The controller 228 adjusts the tuning capacitor 208 based on the value c2 multiplied by the phase error which is added to the value d2 multiplied by the mag error. The controller 228 adjusts the tuning and determines whether a reflected power value is within a predetermined range.

Once a successful tuning is established in the second mode, the controller 228 switches back to the first mode and the controller 228 operates in the first mode until another tuning failure is determined. If another tuning failure is determined while operating in the second mode, then the controller 228 switches to the third mode.

In the third mode, the controller 228 can mix a percentage of phase error and mag error to generate a new signal, then use two new signals to adjust C1 and C2. The controller 228 may adjust the tuning capacitor 206 based on a first composite value of the magnitude error value and the phase error value, and the load capacitor 206 based on a second composite value of the magnitude error value and the phase error value. The following formula describes the application of an embodiment of the third mode:

a3*Phase_error+b3*Mag_error controls load capacitor(C1);

c3*Phase_error+d3*Mag_error controls tune capacitor(C2).

In the third mode, a3, b3, c3, d3 are predetermined real coefficient values (positive or negative) to optimize tuning for some load range. Therefore, if the load falls into the load range, the third mode will drive the network out of dead-zone, and find the tuning point. Based on the phase error and mag error and the applied coefficient values, there may be one or more combinations of coefficient values that will take the matching network out of a dead-zone.

In the third mode, the controller 228 adjusts the load capacitor 206 based on the value a3 multiplied by the phase error which is added to the value b3 multiplied by the mag error. The controller 228 adjusts the tuning capacitor 208 based on the value c3 multiplied by the phase error which is added to the value d3 multiplied by the mag error. The controller 228 adjusts the tuning and determines whether a reflected power value is within a predetermined range.

Once a successful tuning is established in the third mode, the controller 228 switches back to the first mode and the controller 228 operates in the first mode until another tuning failure is determined. If another tuning failure is determined while operating in the third mode, then the controller 228 switches to successful n modes.

Predetermined coefficient values for a2, b2, c2, and d2 for a3, b3, c3, d3 may be stored in a data storage device or memory in table form, database, or otherwise. Also, the coefficient values may be input manually though a user interface, or a command line function or tool. The predetermined coefficient values can be any combination of whole number, or fractions such as 0.5, 1.5, etc.

Particular coefficient values may be associated with characteristics of a particular chamber. For example, coefficient values may be predetermined for different chamber configurations and stored in memory for use by the tuning modes. In one embodiment, a matrix of nine chamber configurations could be stored in memory with associated coefficient values: 1) high resistance/high reactance, 2) high resistance/medium reactance, 3) high resistance/low reactance, 4) medium resistance/high reactance, 5) medium resistance/medium reactance, 6) medium resistance/low reactance, 7) low resistance/high reactance, 8) low resistance/medium reactance, and 9) low resistance/low reactance.

FIG. 4 illustrates an exemplary table (Table 1) describing combinations of phase and mag capacitor control combinations for varying resistance and reactance conditions. For example, referring to the first row, under heading Phase, C2+, and Mag C1+, column "Zi" identifies resistance and reactance. The column "Tuned" identifies whether the network tuned, and the column "Time" describes the amount of time to tune. Lastly, the column "Chart" refers to corresponding graphs depicted in FIGS. 5, 6 and 7.

In Row 1 of Table 1 described in FIG. 4, Phase is C2+, and Mag is C1+ as one of the control combinations. In column Zi, the value "20−j40" refers to a high resistance (which is 20), and a high reactance (which is −40). In this example, the network did not tune. The Time is not applicable in this case. The results of these tuning parameters are depicted in Chart 502 referenced in FIG. 5.

In Row 4 of Table 1 described in FIG. 4, Phase is C2+, and Mag is C1+ as one of the control combinations. In column Zi, the value "5−j40" refers to a medium resistance (which is 5), and a high reactance (which is −40). In this example, the network tuned with a time to tune of 1.5 seconds. The results of these tuning parameters are depicted in Chart 602 referenced in FIG. 6.

In Row 10 of Table 1 described in FIG. 4, Phase is C1+, and Mag is C2− as one of the control combinations. In column Zi, the value "20−j40" refers to a high resistance (which is 20), and a high reactance (which is −40). In this example, the network tuned with a time to tune of 2.8 seconds. The results of these tuning parameters are depicted in Chart 504 referenced in FIG. 5.

In Row 18 of Table 1 described in FIG. 4, Phase is C1+, and Mag is C2− as one of the control combinations. In column Zi the value "0.5+j40" refers to a low resistance (which is 0.5), and a high reactance (which is 40). In this example, the network tuned with a time to tune of 3.5 seconds. The results of these tuning parameters are depicted in Chart 710 referenced in FIG. 7.

Figure 5:
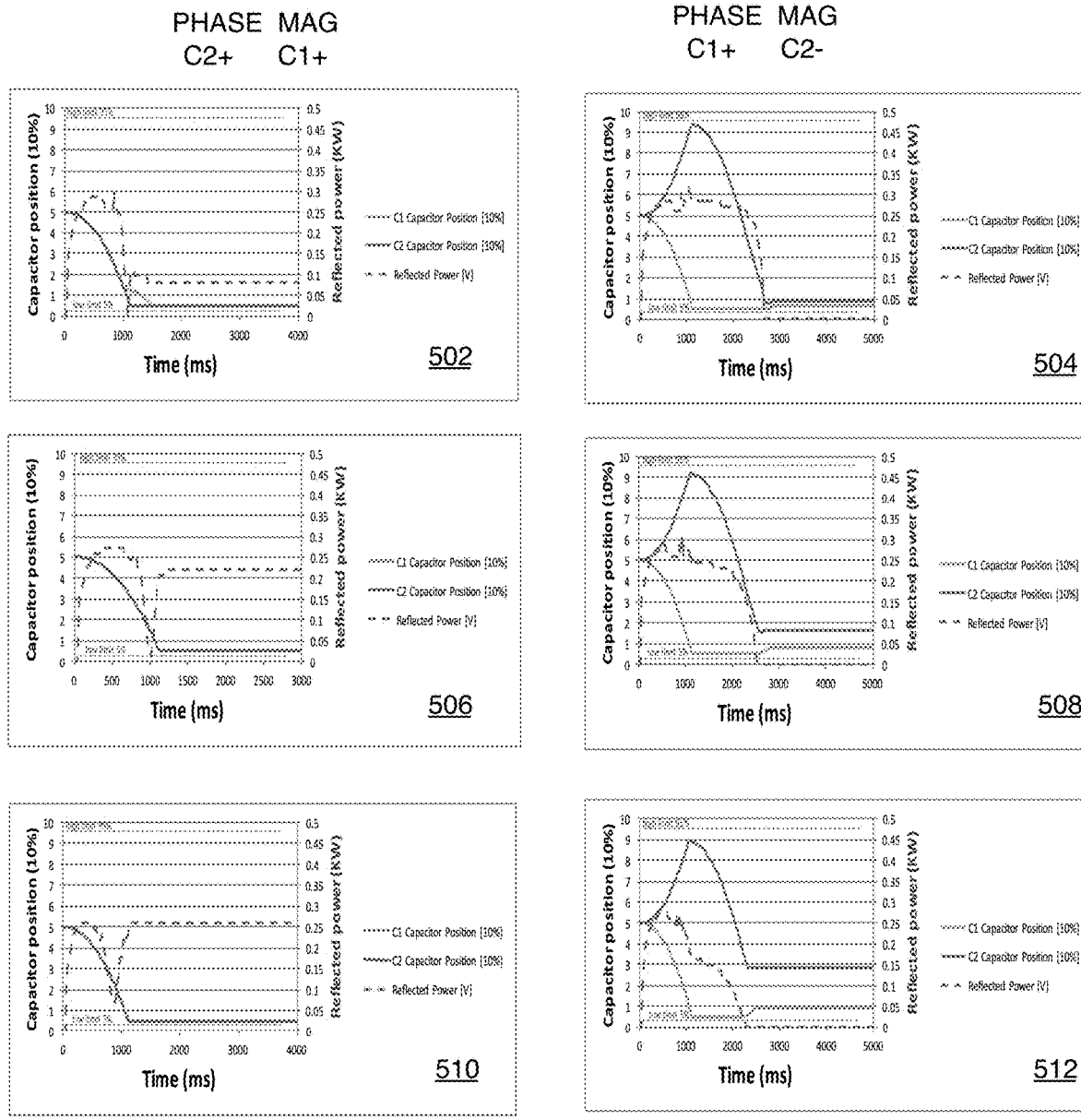
FIG. 5 illustrates exemplary graphs depicting variable positioned tuning and load capacitor and resulting reflected power.
Figure 6:
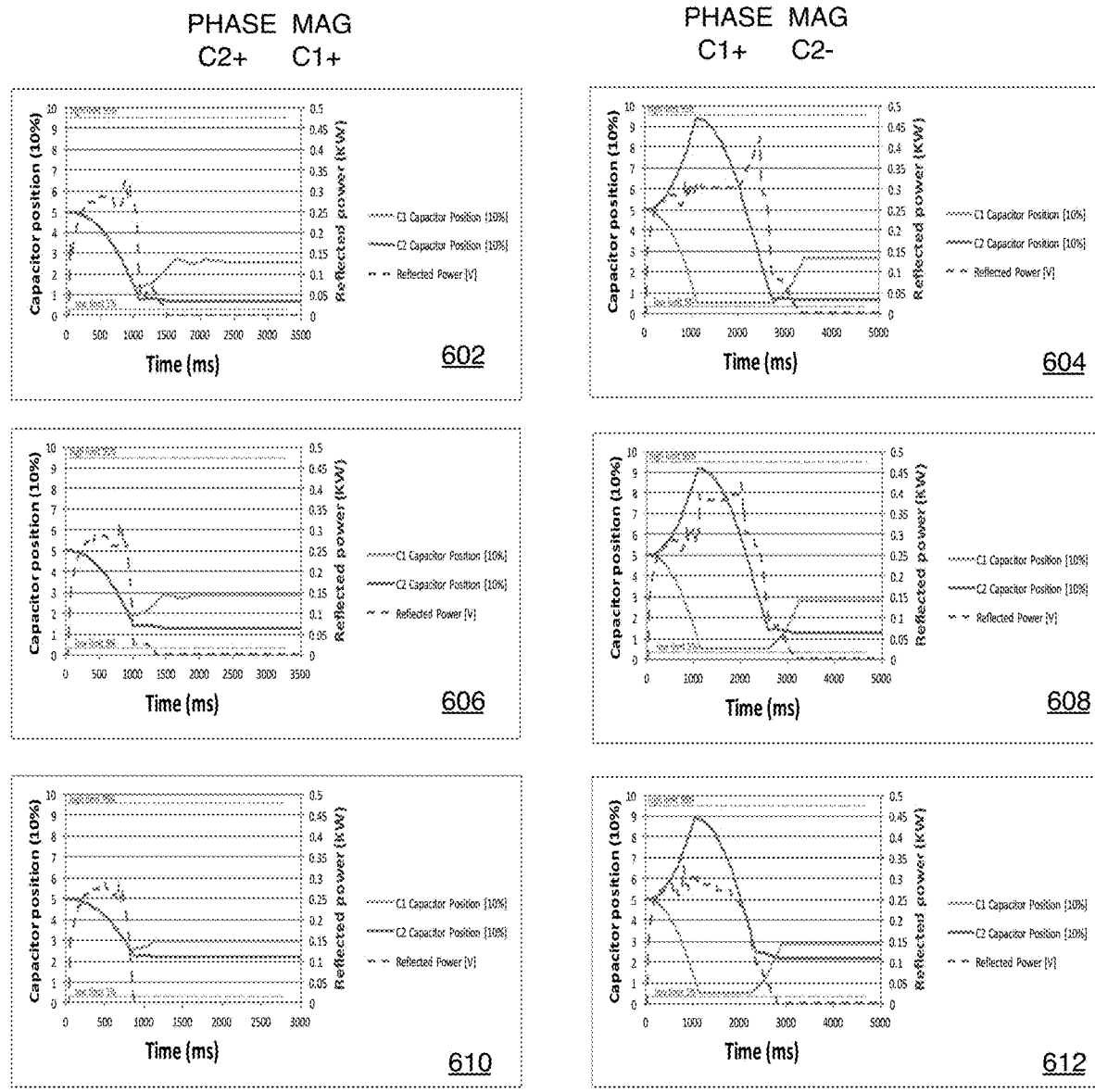
FIG. 6 illustrates exemplary graphs depicting variable positioned tuning and load capacitor and resulting reflected power.
Figure 7:
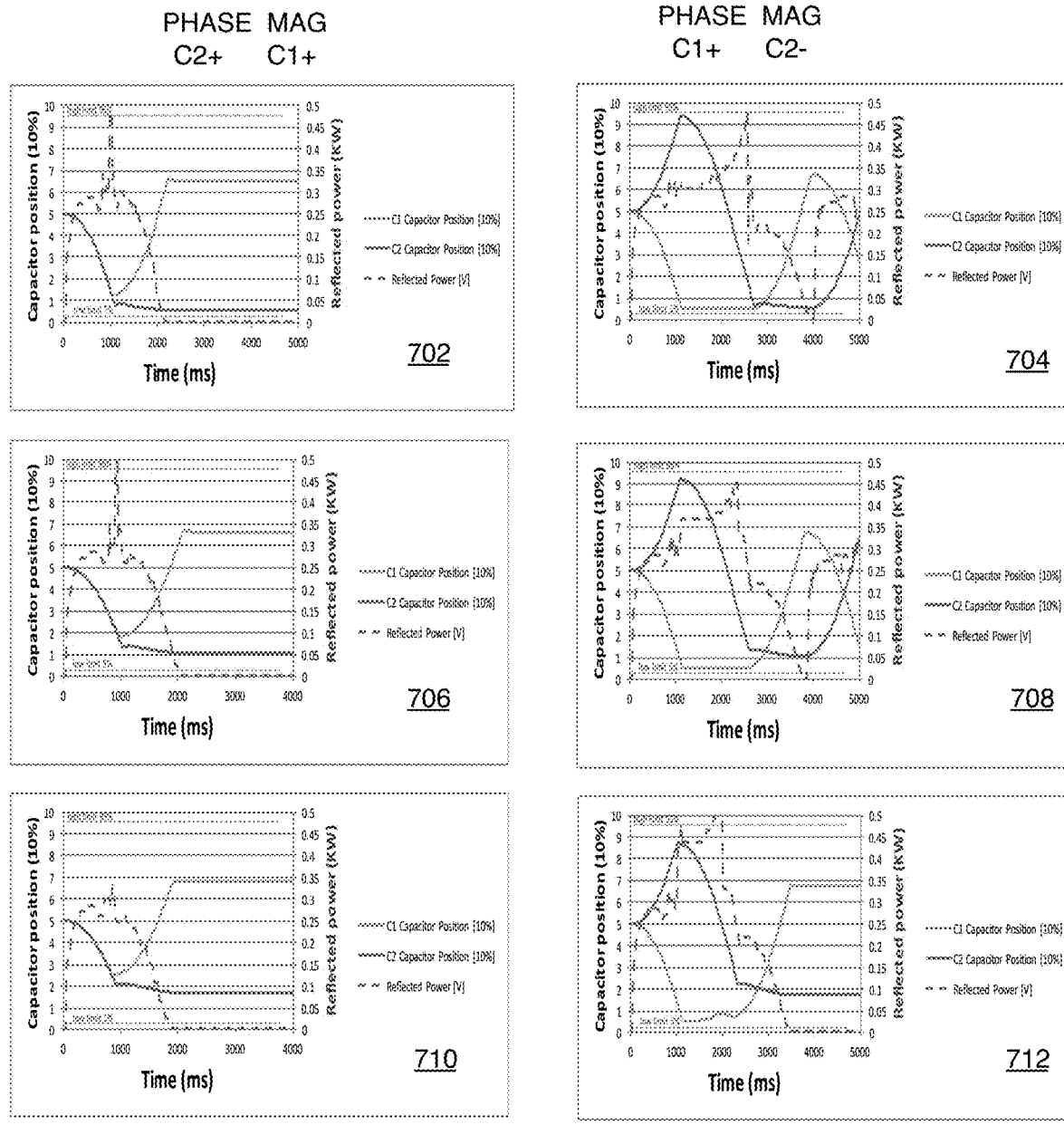
FIG. 7 illustrates exemplary graphs depicting variable positioned tuning and load capacitor and resulting reflected power.

Referring to FIGS. 5-7, each chart 502, 504, 506, 508, 510, 512, 602, 604, 606, 608, 610, 612, 702, 704, 706, 708, 710 and 712 depicts positional settings for the load capacitor (C1) 206 and the tuning capacitor (C2) 208, and the reflected power for each of the capacitor positional settings over a period of time. The allowable capacitor positional settings range from 0% to 100%. The higher the positional setting, the higher the capacitance for the capacitor. Positional adjustment of the load capacitor and tuning capacitor affect the reflected power from the load. In the charts, the reflected power is displayed in kilowatts. Each chart depicts Time in milliseconds. The desired goal of tuning the match network is to drive the reflected power as close to zero kilowatts as possible.

In each of the examples, the load capacitor (C1) and the tuning capacitor (C2) are initially set to 50% of their positional range.

In the examples depicted in charts 502, 506, 510, 602, 606, 610, 702, 706 and 710 both the load capacitor (C1) and the tuning capacitor (C2) are repositioned over time initially in the same direction. In these examples, based on the phase error the controller 228 adjusts the tuning capacitor (C2), and based the magnitude error the controller 228 adjusts the load capacitor (C1).

In the examples depicted in charts 504, 508, 512, 604, 608, 612, 704, 708, 712 the load capacitor and the tuning capacitor are repositioned over time initially in opposite directions. In these examples, based on the phase error the controller 228 adjusts the load capacitor (C1), and based on the magnitude error the controller 228 adjusts the tuning capacitor (C2).

It is to be understood that the preceding disclosure describes several exemplary embodiments for implementing different features, structures, or functions of the invention. Exemplary embodiments of components, arrangements, and configurations are described above to simplify the present disclosure; however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented above may be combined in any combination of ways, i.e., any element from one exemplary embodiment may be used in any other exemplary embodiment, without departing from the scope of the disclosure.

Additionally, certain terms are used throughout the preceding description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Additionally, in the preceding discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

In general, the terms "module" as used herein refer to logic embodied in hardware or firmware, or to a collection of software instructions, possibly having entry and exit points, written in a programming language, such as, for example, Java, Lua, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital videodisc, flash drive, or any other tangible medium. Such software code may be stored, partially or fully, on a memory device of the executing computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules described herein are preferably implemented as software modules, but may be represented in hardware or firmware. Generally, the modules described herein refer to logical modules that may be combined with other modules or divided into sub-modules despite their physical organization or storage. Electronic data sources can include databases, volatile/non-volatile memory, and any memory system or subsystem that maintains information.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

We claim:

1. A matching network system, comprising:
    an input sensor;
    a controller coupled to the input sensor;
    a first motor coupled to the controller, the first motor coupled to a variable load capacitor;
    a second motor coupled to the controller, the second motor coupled to a variable tuning capacitor;
    wherein the input sensor is configured to determine a current value, a voltage value, and a phase value between the current value and the voltage value of the input signal;
    wherein the controller is configured to:
        determine a phase error value and a magnitude error value;
        perform tuning of the load capacitor and the tuning capacitor using two or more modes to tune the matching network system, the tuning comprising:
            performing a first tuning mode, comprising:
                adjusting a position of the tuning capacitor based on the magnitude error value;
                adjusting a position of the load capacitor based on the phase error value; and
                determining whether a dead-zone has occurred;
            if a dead-zone has occurred in the first tuning mode, then performing a second tuning mode, comprising:
                adjusting the position of the tuning capacitor based on a first composite value of the magnitude error value and the phase error value; and
                adjusting the position of the load capacitor based on a second composite value of the magnitude error value and the phase error value; and
            determining whether the matching system has reached a tuned state; and
            if the matching network has reached a tuned state, then performing the first tuning mode.

2. The matching network system of claim 1, wherein the first composite value is determined by adding the product of a first predetermined value by the phase error, and adding the product of a second predetermined value by the magnitude error, and wherein the second composite value is determined by adding the product of a third predetermined value by the phase error, and adding the product of a second predetermined value by the magnitude error.

3. The matching network system of claim 2, wherein each of the first predetermined value, the second predetermined value, the third predetermined value, and the fourth predetermined value is a predetermined real coefficient value.

4. The matching network system of claim 3, wherein the each of the first, second, third and fourth values include at least one fractional value, and one integer value.

5. The matching network system of claim 1, wherein the load capacitor is tuned based on the formula a1*Phase_error+a2*Mag_error, wherein a1 and a2 are predetermined coefficient values, Phase_error is a phase error value, and Mag_error is a magnitude error value.

6. The matching network system of claim 1, wherein the tuning capacitor is tuned based on the formula a1*Phase_error+a2*Mag_error, wherein a1, and a2 are predetermined coefficient values, Phase_error is a phase error value, and Mag_error is a magnitude error value.

7. The matching network system of claim 1, further comprising:
    if a dead-zone has occurred in the second tuning mode, then performing a third tuning mode, comprising:
        adjusting the position of the tuning capacitor based on a first composite value of the magnitude error value and the phase error value;
        adjusting the position of the load capacitor based on a second composite value of the magnitude error value and the phase error value; and
        determining whether the matching network system has reached a tuned state; and
    if the matching network system has reached a tuned state, then performing the first tuning mode.

8. The matching network system of claim 1, wherein determining whether a dead-zone occurs comprising identifying that the position of the first variable capacitor or the second variable capacitor fixed in position and does not move, or that the first variable capacitor or the second variable capacitor oscillates about a position.

9. The matching network system of claim 1, wherein in the first mode, the first variable capacitor has moved in a first direction until the reaching the dead-zone, and while in the second tuning mode moving the position of the first variable capacitor in an opposition direction than the first direction.

10. The matching network system of claim 1, wherein in the first mode, the second variable capacitor has moved in a first direction until the reaching the dead-zone, and while in the second tuning mode moving the position of the second variable capacitor in an opposition direction than the first direction.

11. A method for tuning an impedance matching network, comprising:
    receiving an RF input signal;
    determining a current value, a voltage value, and a phase value between the current value and the voltage value of the RF input signal;
    determining a phase error value and a magnitude error value;
    performing tuning of the matching network using two or more modes to tune the matching network, the tuning comprising:
        performing a first tuning mode, comprising:
            adjusting a position of a first variable capacitor based on the magnitude error value; and
            adjusting a position of second variable capacitor based on the phase error value; and
            determining whether a dead-zone has occurred;
        if a dead-zone has occurred in the first tuning mode, then performing a second tuning mode, comprising:
            adjusting the position of the first variable capacitor based on a first composite value of the magnitude error value and the phase error value; and
            adjusting the position of the second variable capacitor based on a second composite value of the magnitude error value and the phase error value; and determining whether the matching network has reached a tuned state; and if the matching network has reached a tuned state, then performing the first tuning mode.

12. The method of claim 11, wherein the first composite value is determined by adding the product of a first predetermined value by the phase error, and adding the product of a second predetermined value by the magnitude error, and wherein the second composite value is determined by adding the product of a third predetermined value by the phase error, and adding the product of a second predetermined value by the magnitude error.

13. The method of claim 12, wherein each of the first predetermined value, the second predetermined value, the third predetermined value, and a fourth predetermined value is a predetermined real coefficient value.

14. The method of claim 12, wherein each of the first predetermined value, the second predetermined value, the third predetermined value, and a fourth predetermined value include at least one fractional value and one integer value.

15. The method of claim 12, wherein the first variable capacitor is a load capacitor, the load capacitor is tuned based on the formula a1*Phase_error+a2*Mag_error, wherein a1 and a2 are predetermined coefficient values, Phase_error is a phase error value, and Mag_error is a magnitude error value.

16. The method of claim 12, wherein the first variable capacitor is a tuning capacitor, the tuning capacitor is tuned based on the formula a1*Phase_error+a2*Mag_error, wherein a1 and a2 are predetermined coefficient values, Phase_error is a phase error value, and Mag_error is a magnitude error value.

17. The method of claim 12, further comprising:

if a dead-zone has occurred in the second tuning mode, then performing a third tuning mode, comprising:

adjusting the position of the first variable capacitor based on a first composite value of the magnitude error value and the phase error value; and adjusting the position of the second variable capacitor based on a second composite value of the magnitude error value and the phase error value;

determining whether the matching network has reached a tuned state; and if the matching network has reached a tuned state, then performing the first tuning mode.

18. The method of claim 12, wherein determining whether a dead-zone occurs comprising identifying that the position of the first variable capacitor or the second variable capacitor is fixed in position and does not move, or that the first variable capacitor or the second variable capacitor oscillates about a position.

19. The method of claim 12, wherein in the first mode, the first variable capacitor has moved in a first direction until the reaching the dead-zone, and while in the second tuning mode moving the position of the first variable capacitor in an opposition direction than the first direction.

20. The method of claim 12, wherein in the first mode, the second variable capacitor has moved in a first direction until the reaching the dead-zone, and while in the second tuning mode moving the position of the second variable capacitor in an opposition direction than the first direction.

* * * * *